United States Patent
Mimura

(10) Patent No.: US 10,707,833 B2
(45) Date of Patent: Jul. 7, 2020

(54) ELASTIC WAVE DEVICE

(71) Applicant: Murata Manufacturing Co., Ltd., Nagaokakyo-shi, Kyoto-fu (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 23 days.

(21) Appl. No.: 16/188,419

(22) Filed: Nov. 13, 2018

(65) Prior Publication Data

US 2019/0097607 A1 Mar. 28, 2019

Related U.S. Application Data

(63) Continuation of application No. PCT/JP2017/017146, filed on May 1, 2017.

(30) Foreign Application Priority Data

Jun. 28, 2016 (JP) .................. 2016-127364

(51) Int. Cl.
*H03H 9/64* (2006.01)
*H03H 9/145* (2006.01)
(Continued)

(52) U.S. Cl.
CPC ...... *H03H 9/6496* (2013.01); *H03H 9/02559* (2013.01); *H03H 9/02637* (2013.01);
(Continued)

(58) Field of Classification Search
CPC ............. H03H 9/6496; H03H 9/02559; H03H 9/02637; H03H 9/02834; H03H 9/02866;
(Continued)

(56) References Cited

U.S. PATENT DOCUMENTS

2001/0013817 A1  8/2001  Taniguchi
2011/0068655 A1  3/2011  Solal et al.
(Continued)

FOREIGN PATENT DOCUMENTS

JP   11-274887 A   10/1999
JP   2011-101350 A   5/2011
(Continued)

OTHER PUBLICATIONS

Official Communication issued in International Patent Application No. PCT/JP2017/017146, dated Jul. 4, 2017.

*Primary Examiner* — Stephen E. Jones
*Assistant Examiner* — Samuel S Outten
(74) *Attorney, Agent, or Firm* — Keating & Bennett, LLP

(57) ABSTRACT

An elastic wave device includes a piezoelectric substrate and IDT electrodes including first and second busbars and first and second electrode fingers. An intersection of the IDT electrodes includes a center region, and low-acoustic-velocity sections at both end portions of the center region in the direction in which the electrode fingers extend in the center region, sections in which the acoustic velocity is lower than in the center region. The length of the gap between the edge of the first electrode fingers and the second busbar and the length of the gap between the edge of the second electrode fingers and the first busbar are about 0.62λ or more and about 0.98λ or less, where λ denotes the wavelength, which is determined by the finger pitch of the IDT electrodes.

18 Claims, 6 Drawing Sheets

(51) Int. Cl.
*H03H 9/25* (2006.01)
*H03H 9/02* (2006.01)

(52) U.S. Cl.
CPC .... *H03H 9/02834* (2013.01); *H03H 9/02866* (2013.01); *H03H 9/02992* (2013.01); *H03H 9/14538* (2013.01); *H03H 9/14541* (2013.01); *H03H 9/25* (2013.01)

(58) Field of Classification Search
CPC .......... H03H 9/02992; H03H 9/14538; H03H 9/14541; H03H 9/25
See application file for complete search history.

(56) References Cited

U.S. PATENT DOCUMENTS

| | | | |
|---|---|---|---|
| 2012/0105174 A1* | 5/2012 | Lee | G01N 29/022 |
| | | | 333/193 |
| 2013/0051588 A1 | 2/2013 | Ruile et al. | |
| 2013/0249647 A1 | 9/2013 | Nakanishi et al. | |
| 2016/0087186 A1* | 3/2016 | Burak | H03H 9/173 |
| | | | 310/349 |
| 2017/0279433 A1* | 9/2017 | Matsukura | H03H 9/14541 |

FOREIGN PATENT DOCUMENTS

| | | |
|---|---|---|
| JP | 2012-186808 A | 9/2012 |
| JP | 2013-518455 A | 5/2013 |
| JP | 2013-544041 A | 12/2013 |
| KR | 10-0340286 B1 | 6/2002 |

\* cited by examiner

ELASTIC WAVE DEVICE

CROSS REFERENCE TO RELATED APPLICATIONS

This application claims the benefit of priority to Japanese Patent Application No. 2016-127364 filed on Jun. 28, 2016 and is a Continuation Application of PCT Application No. PCT/JP2017/017146 filed on May 1, 2017. The entire contents of each application are hereby incorporated herein by reference.

BACKGROUND OF THE INVENTION

1. Field of the Invention

The present invention relates to an elastic wave device that uses a piston mode.

2. Description of the Related Art

Japanese Unexamined Patent Application Publication No. 2011-101350 discloses an elastic wave device that uses a piston mode. The elastic wave device in Japanese Unexamined Patent Application Publication No. 2011-101350 includes a piezoelectric substrate and interdigital transducer (IDT) electrodes on the piezoelectric substrate. The IDT electrodes have a center region and edge regions in the intersection of the electrode fingers. The center region is in the middle of the intersection and the edge regions outside the center region, both in the direction in which the electrode fingers extend.

In Japanese Unexamined Patent Application Publication No. 2011-101350, approaches are taken including placing a dielectric layer on the electrode fingers in the edge regions, placing a dielectric layer on the electrode fingers in the center region, and increasing the electrode width in the edge regions, thereby making the acoustic wave velocity in the edge regions slower than that in the center region. Japanese Unexamined Patent Application Publication No. 2011-101350 also mentions that the length of the gap between the edge of the electrode fingers and the busbars is longer than one wavelength of the acoustic waves propagated within the IDT electrodes.

Since the length of the gap between the edge of the electrode fingers and the busbars is longer than one wavelength of the acoustic waves propagated within the IDT electrodes, however, elastic wave devices of the type described in Japanese Unexamined Patent Application Publication No. 2011-101350 may have ripples caused by higher-order transverse modes controlled only insufficiently. Worse yet, trying to reduce the ripples caused by higher-order transverse modes can affect the filter characteristics or loss for the dominant mode.

SUMMARY OF THE INVENTION

Preferred embodiments of the present invention provide elastic wave devices that reduce ripples caused by higher-order transverse modes with less degradation of the filter characteristics and loss for a dominant mode.

An elastic wave device includes a piezoelectric body and interdigital transducer electrodes on the piezoelectric body. The interdigital transducer electrodes include opposing first and second busbars, a plurality of first electrode fingers connected at one end to the first busbar, and a plurality of second electrode fingers interdigitated with the first electrode fingers and connected at one end to the second busbar. When an intersection is defined as an area in which the first and second electrode fingers overlap when viewed in the direction of propagation of an elastic wave, the intersection includes a center region and low-acoustic-velocity sections located at both end portions of the center region in the direction in which the electrode fingers extend. In the low-acoustic-velocity sections, the acoustic velocity is lower than in the center region. The length of the gap between the edge of the first electrode fingers and the second busbar and that between the edge of the second electrode fingers and the first busbar are about 0.62λ or more and about 0.98λ or less, where λ denotes the wavelength, which is determined by the finger pitch of the interdigital transducer electrodes.

In a particular aspect of an elastic wave device according to a preferred embodiment of the present invention, the length of the gap between the edge of the first electrode fingers and the second busbar and that between the edge of the second electrode fingers and the first busbar are about 0.72λ or more and about 0.92λ or less, where λ denotes the wavelength, which is determined by the finger pitch of the interdigital transducer electrodes. This provides more effective reduction of ripples caused by higher-order transverse modes as well as even less degradation of the filter characteristics and loss for the dominant mode.

In another particular aspect of an elastic wave device according to a preferred embodiment of the present invention, the piezoelectric body is a rotated Y-cut LiNbO₃ substrate with an angle of rotation of about 116° or more and about 136° or less.

In yet another particular aspect of an elastic wave device according to a preferred embodiment of the present invention, a width of the intersection in the direction in which the electrode fingers extend is about 12.5λ or less.

In still another particular aspect of an elastic wave device according to a preferred embodiment of the present invention, the first and second electrode fingers are thicker in the low-acoustic-velocity sections than in any other portion.

In a further particular aspect of an elastic wave device according to a preferred embodiment of the present invention, there is another layer on the first and second electrode fingers in the low-acoustic-velocity sections.

According to preferred embodiments of the present invention, elastic wave devices are provided that reduce ripples caused by higher-order transverse modes with less degradation of the filter characteristics and loss for a dominant mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes specific preferred embodiments of the present invention with reference to the drawings.

It is to be noted that the preferred embodiments described herein are illustrative and partial replacement or combination of the configurations between different preferred embodiments is possible.

Figure 1:
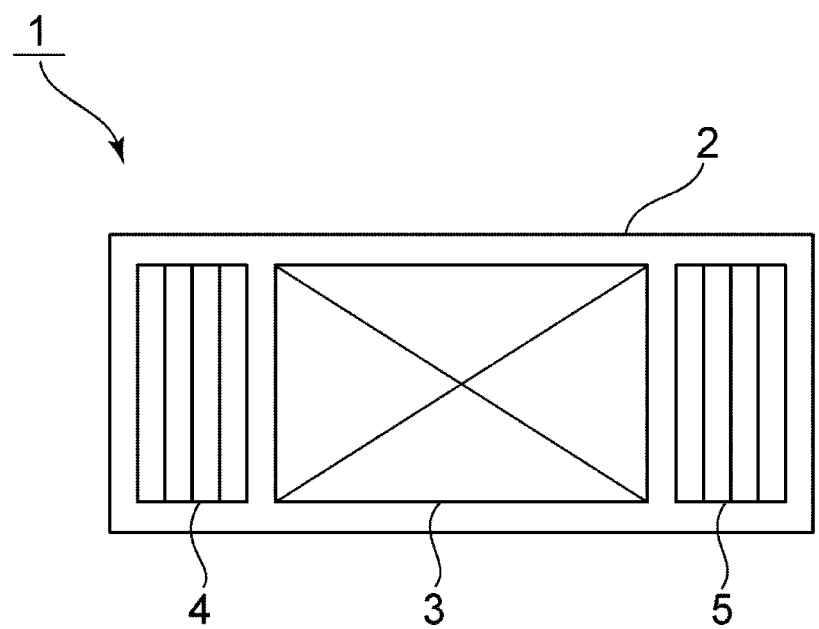
FIG. 1 is a schematic plan view of an elastic wave device according to a preferred embodiment of the present invention.
Figure 2:
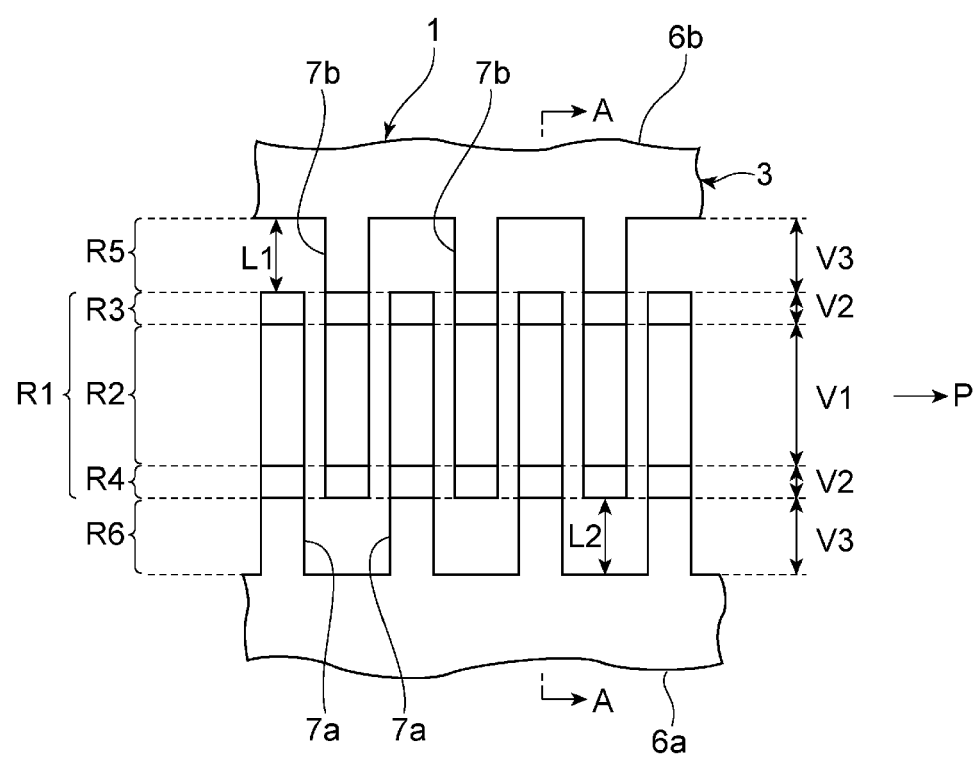
FIG. 2 is a schematic plan view of an elastic wave device according to a preferred embodiment of the present invention, illustrating an enlarged view of the IDT electrode section.
Figure 3:
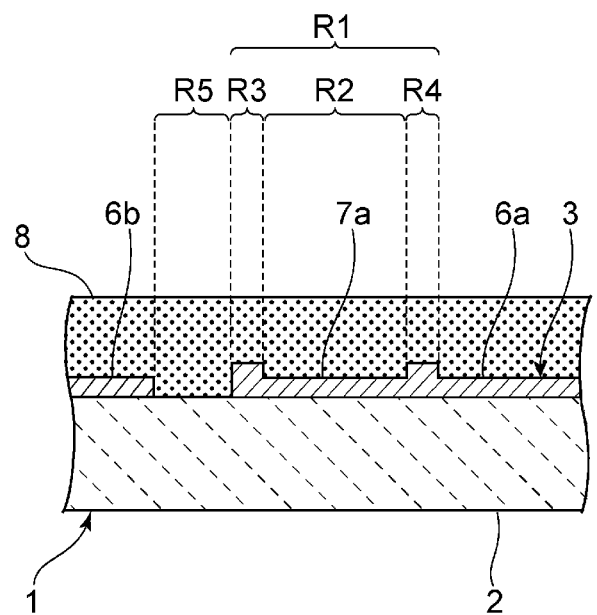
FIG. 3 is a schematic cross-section along line A-A in FIG. 2.

FIG. 1 is a schematic plan view of an elastic wave device according to a preferred embodiment of the present invention. FIG. 2 is a schematic plan view of an elastic wave device according to a preferred embodiment of the present invention, illustrating an enlarged view of the IDT electrode section. FIG. 3 is a schematic cross-section along line A-A in FIG. 2. For the sake of convenience in making the drawings, the dielectric film 8 in FIG. 3 is not illustrated in FIGS. 1 and 2.

As illustrated in FIG. 1, the elastic wave device 1 includes a piezoelectric substrate 2 as the piezoelectric body. The piezoelectric substrate 2 is made from a piezoelectric single crystal, for example, of $LiTaO_3$ or $LiNbO_3$. The piezoelectric substrate 2 may be a piezoelectric ceramic substrate. It is to be noted that the piezoelectric body of the elastic wave device 1 may be a piezoelectric thin film on a support substrate. The piezoelectric body of the elastic wave device 1, moreover, may be a piezoelectric thin film on a multilayer film provided on a support substrate. The multilayer film may include, for example, a stack of a high-acoustic-velocity film and a low-acoustic-velocity film on the high-acoustic-velocity film. In the high-acoustic-velocity film, bulk waves propagate faster than elastic waves propagate through the piezoelectric thin film, and in the low-acoustic-velocity film, bulk waves propagate more slowly than elastic waves propagate through the piezoelectric thin film. When a multilayer film having such high- and low-acoustic-velocity films is used, the piezoelectric thin film may be on the low-acoustic-velocity film.

Preferably, the piezoelectric substrate 2 is a rotated Y-cut $LiNbO_3$ substrate with an angle of rotation of about 116° or more and about 136° or less, for example.

On the piezoelectric substrate 2 are interdigital transducer (IDT) electrodes 3. FIG. 1 illustrates the IDT electrodes 3 schematically, with their positions only. There are reflectors 4 and 5 on both sides of the IDT electrodes 3 in the direction of propagation of the elastic waves, defining a one-port elastic wave resonator. The elastic wave device 1 is therefore a one-port elastic wave resonator. It should be understood that the elastic wave devices according to preferred embodiments of the present invention is not limited to an elastic wave resonator and may be a different elastic wave device, such as an elastic wave filter.

Examples of metallic materials that can be used for the IDT electrodes 3 include Cu, Ag, Au, Mo, W, Ta, Pt, Al, Ti, Ni, and Cr and alloys of these metals. The IDT electrodes 3 may be single-layer metal films, or may be multilayer metal films in which two or more kinds of metal films are stacked.

As illustrated in FIG. 3, a dielectric film 8 covers the IDT electrodes 3. The purpose of the dielectric film 8 is to reduce the absolute TCF, temperature coefficient of resonant frequency. In other words, the dielectric film 8 is a dielectric film for temperature compensation. The dielectric film 8 is made of, for example, a dielectric ceramic material, such as silicon oxide or silicon oxide nitride. The dielectric film 8 may be a layer that fulfills any other function.

The following describes the structure of the IDT electrodes 3 as a component of the elastic wave device 1 in further detail.

As illustrated in FIG. 2, the IDT electrodes 3 include first and second busbars 6a and 6b and multiple first and second electrode fingers 7a and 7b. The first and second busbars 6a and 6b are facing each other.

The multiple first electrode fingers 7a are connected at one end to the first busbar 6a, and the multiple second electrode fingers 7b are connected at one end to the second busbar 6b. The first and second electrode fingers 7a and 7b are interdigitated.

As illustrated in FIG. 2, the first electrode fingers 7a and second electrode fingers 7b have an area in which they overlap when viewed in the direction P of propagation of the elastic waves. This area of overlap is the intersection R1.

The intersection R1 includes a center region R2 and first and second edge regions R3 and R4. The center region R2 is in the middle of the intersection R1 in the direction in which the first and second electrode fingers 7a and 7b extend. The first and second edge regions R3 and R4 are on both sides of the center region R2 in the direction in which the first and second electrode fingers 7a and 7b extend.

As illustrated in FIG. 3, the first electrode fingers 7a are thicker in the first and second edge regions R3 and R4 than in the center region R2. Although not illustrated, the second electrode fingers 7b are thicker in the first and second edge regions R3 and R4 than in the center region R2 likewise. Since the electrode fingers are thicker in the first and second edge regions R3 and R4 than in the center region R2 in this way, and this makes the acoustic velocity slower in the edge regions. That is, the acoustic velocity V2 in the first and second edge regions R3 and R4 is made slower than the acoustic velocity V1 in the center region R2, generating a piston mode. Thus, the first and second edge regions R3 and R4 are low-acoustic-velocity sections, in which the acoustic velocity is slower than in the center region R2.

Moreover, as illustrated in FIG. 2, there is a first gap region R5 outside the first edge region R3 in the direction in which the first and second electrode fingers 7a and 7b extend. The first gap region R5 lies between the edge of the first electrode fingers 7a and the second busbar 6b.

Likewise, there is a second gap region R6 outside the second edge region R4 in the direction in which the first and second electrode fingers 7a and 7b extend. The second gap region R6 lies between the edge of the second electrode fingers 7b and the first busbar 6a.

Since the first and second gap regions R5 and R6 are free of electrode fingers, the acoustic velocity V3 in the first and second gap regions R5 and R6 is faster than the acoustic velocity V1 in the center region R2. Thus, the first and second gap regions R5 and R6 are high-acoustic-velocity sections, in which the acoustic velocity is faster than in the center region R2.

In this preferred embodiment, the distance between the edge of the first electrode fingers 7a and the second busbar 6b, or the gap length L1, in the first gap region R5 is about 0.62λ or more and about 0.98λ or less, for example. In the second gap region R6, the distance between the edge of the second electrode fingers 7b and the first busbar 6a, or the gap length L2, is about 0.6λ or more and about 0.9λ or less, for example. λ denotes the wavelength, which is determined by the finger pitch of the IDT electrodes 3.

To summarize, this preferred embodiment is structured such that each of the gap length L1 between the edge of the first electrode fingers 7a and the second busbar 6b and the gap length L2 between the edge of the second electrode fingers 7b and the first busbar 6a is about 0.6λ or more and about 0.98λ or less, for example. More specifically, this preferred embodiment is structured such that by virtue of the gap lengths L1 and L2 falling within the above particular range, ripples caused by transverse modes are reduced with less degradation of the filter characteristics and loss for the dominant mode. This is explained in further detail by the experiment described below.

It should be noted that the transverse modes refer to transverse modes of a higher order than that used by the elastic wave device 1. The elastic wave device 1 uses a fundamental, or a first-order mode, as its dominant mode.

Additionally, the gap length L1 and the gap length L2 are equal or substantially equal in this preferred embodiment. The gap lengths L1 and L2 are therefore collectively referred to as the gap length hereinafter.

In the experiment, elastic wave devices 1 were fabricated as follows that were one-port elastic wave resonators, and the resonator characteristics were evaluated with different gap lengths.

Piezoelectric substrate 2: 126°±10°-rotated Y-cut LiNbO$_3$ substrate (propagation is in the λ direction)
IDT electrodes 3: Al/Pt/LN
Pt film thickness: 0.02λ
Al film thickness: 0.05λ
In the first and second edge regions, an extra 0.009λ Pt film was formed on the Al film.
Duty: 0.50
Intersecting width (a width of the intersection in the direction in which the electrode fingers extend): 12.5λ
Width of a low-acoustic-velocity section (each of the first and second edge regions): 0.541λ
Ratio of the acoustic velocity in the center region to that in the low-acoustic-velocity sections (first and second edge regions): 0.97
Ratio of the acoustic velocity in the center region to that in the high-acoustic-velocity sections (first and second gap regions): 1.08
Anisotropic factor: 0.7485

The anisotropic factor is the value of 1+Γ obtained when the slowness surface is represented by an elliptic approximation, and is expressed by formula (1) below.

$$k_x^2 + (1+\Gamma)k_y^2 = k_0^2 \quad (1)$$

$k_x^2$ is the longitudinal component of the wave number vector, $k_y^2$ is the transverse component of the wave number vector, and $k_0^2$ is the number of acoustic waves in the primary direction of propagation. The primary direction of propagation in the longitudinal direction x is determined by the arrangement of the electrode fingers and is perpendicular or substantially perpendicular to the direction in which the electrode fingers extend.

In the experimental elastic wave devices, a SiO$_2$ film was used as the dielectric film. The experimental elastic wave devices used Rayleigh waves propagating on the LiNbO$_3$ substrate.

Figure 4:
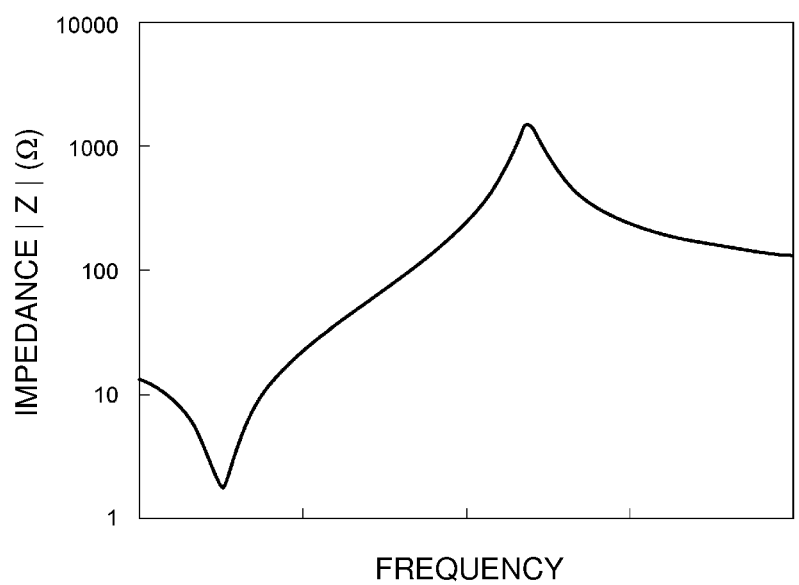
FIG. 4 is a diagram illustrating the impedance characteristics of an experimental elastic wave device with a gap length of about 0.5λ.
Figure 5:
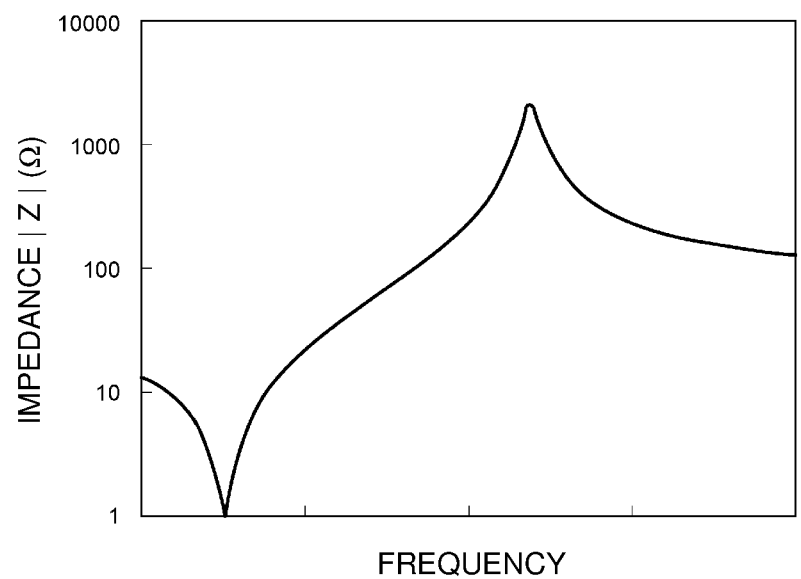
FIG. 5 is a diagram illustrating the impedance characteristics of an experimental elastic wave device with a gap length of about 0.7λ.
Figure 6:
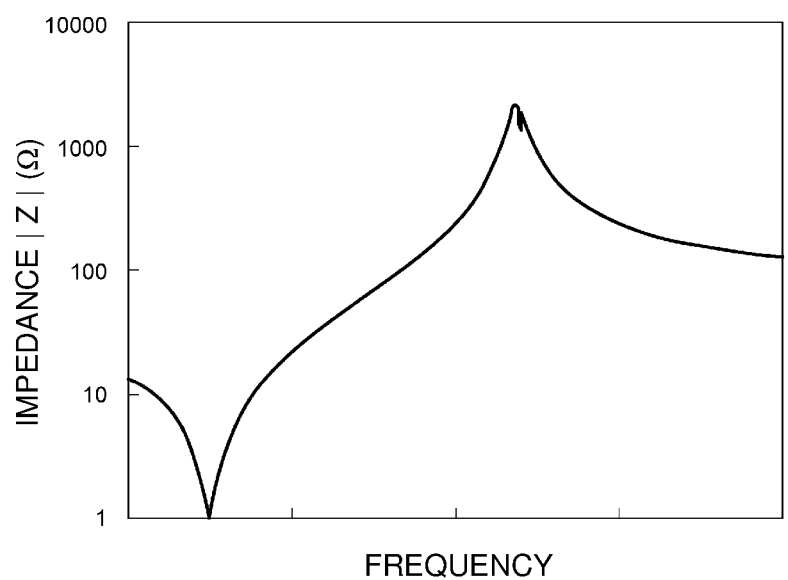
FIG. 6 is a diagram illustrating the impedance characteristics of an experimental elastic wave device with a gap length of about 1.2λ.
Figure 7:
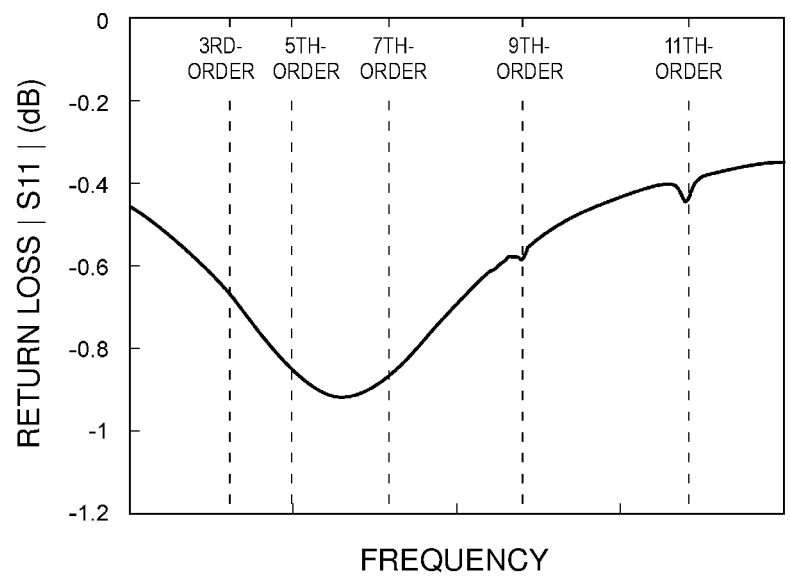
FIG. 7 is a diagram illustrating the return-loss characteristics of an experimental elastic wave device with a gap length of about 0.5λ.
Figure 8:
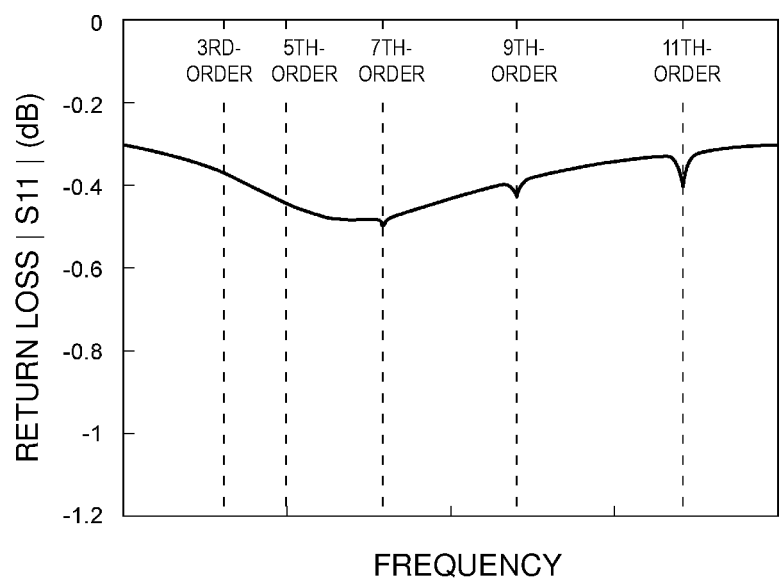
FIG. 8 is a diagram illustrating the return-loss characteristics of an experimental elastic wave device with a gap length of about 0.7λ.
Figure 9:
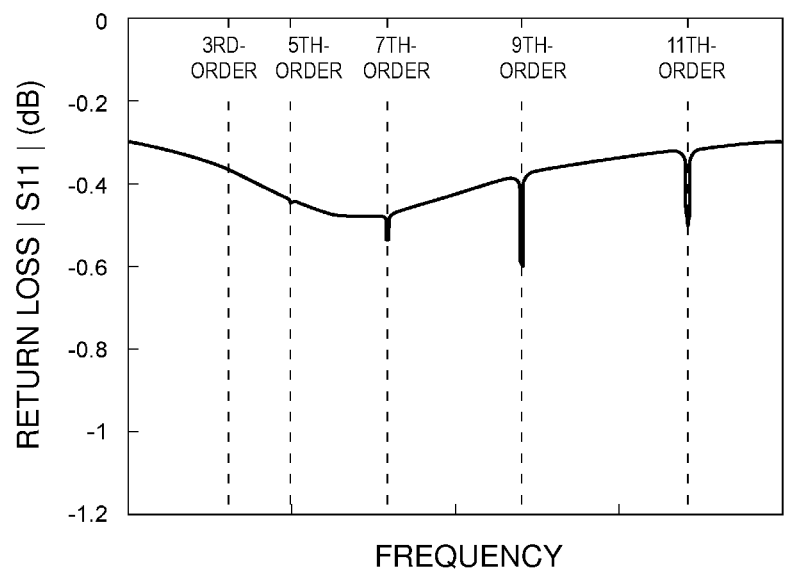
FIG. 9 is a diagram illustrating the return-loss characteristics of an experimental elastic wave device with a gap length of about 1.2λ.

FIGS. 4 to 6 are diagrams illustrating the impedance characteristics of experimental elastic wave devices with gap lengths of about 0.5λ, about 0.7λ, and about 1.2λ, for example. FIGS. 7 to 9 are diagrams illustrating the return-loss characteristics of the experimental elastic wave devices with gap lengths of about 0.5λ, about 0.7λ, and about 1.2λ, for example.

As shown in FIG. 4, the impedance characteristics for the dominant mode were inferior when the gap length was as small as about 0.5λ, for example. As the gap length increased to about 0.7λ and about 1.2λ, by contrast, good impedance characteristics were obtained for the dominant mode, as shown in FIGS. 5 and 6.

Moreover, as shown in FIG. 9, ripples resulted from higher-order transverse modes when the gap length was as large as about 1.2λ, for example. In theory, by improving or optimizing conditions, a piston mode is able to be made completely free of ripples caused by transverse modes of all orders. In practice, however, it is difficult to suppress higher-order transverse modes. Indeed, the characteristics illustrated in FIG. 9 include great ripples resulting from transverse modes, ninth-order and eleventh-order in particular, and they can affect the device characteristics. As the gap length decreased to about 0.7λ and about 0.5λ, for example, by contrast, ripples caused by higher-order transverse modes were reduced, as shown in FIGS. 7 and 8. In particular, the ripples associated with ninth-order and eleventh-order transverse modes, which were of concern when the gap length was about 1.2λ because of their potential impact on the device characteristics, were controlled effectively.

Figure 10:
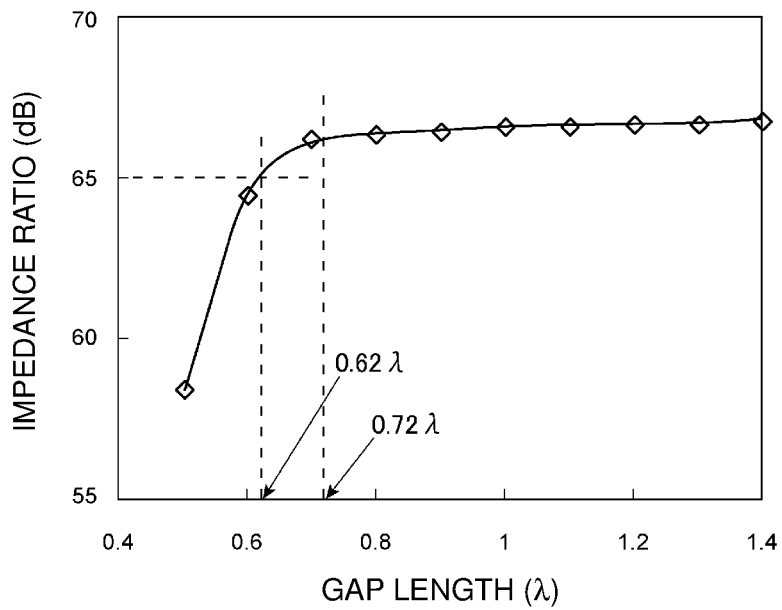
FIG. 10 is a diagram illustrating the relationship between gap length and impedance ratio for experimental elastic wave devices.
Figure 11:
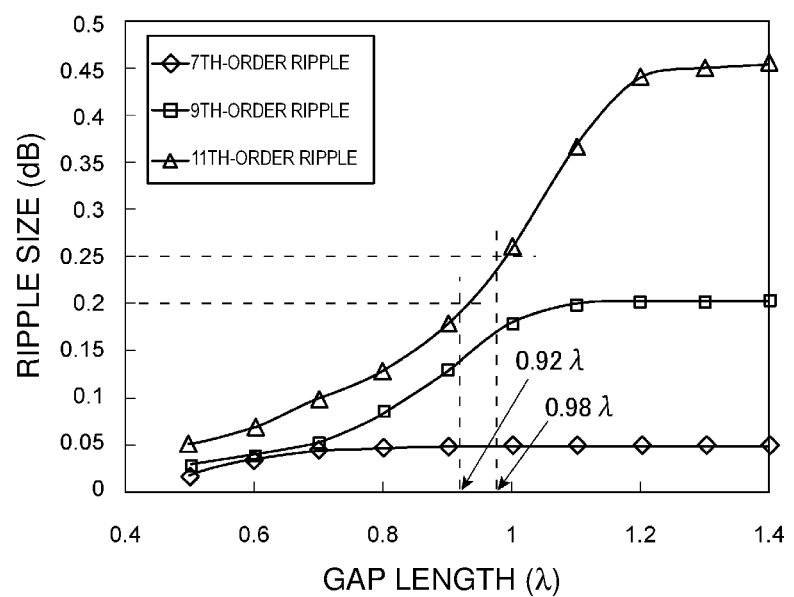
FIG. 11 is a diagram illustrating the relationship between gap length and ripple size for experimental elastic wave devices.

FIG. 10 is a diagram illustrating the relationship between gap length and impedance ratio for experimental elastic wave devices. FIG. 11 is a diagram illustrating the relationship between gap length and ripple size for experimental elastic wave devices.

When a filter by way of example is formed using an elastic wave device, the loss of the filter is better with increasing impedance ratio for the mode of elastic waves the elastic wave device uses mainly. The inventor's study has revealed that when the impedance ratio for the mode of elastic waves the elastic wave device uses mainly is less than about 65 dB, the loss of the filter is worse and the device fails to fully function as a filter. When the impedance ratio for the mode of elastic waves the elastic wave device uses mainly is about 65 dB or more, the inventor's study has discovered, the device is able to fully function as a filter.

When looking at FIG. 10 in light of these discoveries, it can be noticed that good impedance characteristics, equal to or higher than about 65 dB, were obtained when the gap length was about 0.62λ or more, for example. This means that a gap length of about 0.62λ or more results in an impedance ratio of about 65 dB or more for the mode of elastic waves the elastic wave device uses mainly, allowing the device to fully function as a filter.

Moreover, when the gap length was about 0.72λ or more, the impedance characteristics were better, and the impedance ratio was more stable with respect to changes in gap length, for example, caused by fabrication variations.

With respect to the size of ripples resulting from higher-order transverse modes, the inventor's study has revealed that when a ripple is larger than about 0.25 dB, the device fails to fully function as a filter, and when the ripples are about 0.20 dB or smaller, the device is able to fully function as a filter. As can be seen from FIG. 11, gap lengths of about 0.98λ or more resulted in the ripple associated with the eleventh-order transverse mode, which may have greater impact on the device characteristics, being shrunk to about 0.25 dB or less, and gap lengths of about 0.92λ or more resulted in the ripples associated with the ninth-order and eleventh-order transverse modes being shrunk to about 0.20 dB or less, for example. The ripples were therefore reduced more effectively when the gap length was about 0.92λ or less, for example.

Thus, in various preferred embodiments of the present invention, setting the gap length between the edge of the electrode fingers and the busbars to about 0.62λ or more and about 0.98λ or less, for example, will prevent the impedance ratio for the dominant mode from falling and reduce ripples caused by higher-order transverse modes.

In various preferred embodiments of the present invention, moreover, it is preferred that the gap length between the edge of the electrode fingers and the busbars be set to about 0.72λ or more and about 0.92λ or less, for example. This will provide more effective prevention of a fall in the impedance ratio for the dominant mode as well as more steady and reliable reduction of ripples caused by higher-order transverse modes.

The reason for these advantages can be explained as follows.

Each resonant mode loses its amplitude in the high-acoustic-velocity gap regions exponentially toward the busbars. When the gap length is too short in the high-acoustic-velocity gap regions, the attenuation in amplitude at the busbars is insufficient. The resonant mode leaks outside the busbars, resulting in a loss of the device.

When the dominant mode and higher-order transverse modes are compared, the amplitude spreads in the direction toward the busbars more with increasing order. The gap length at which the loss occurs is therefore relatively large for higher-order transverse modes and relatively small for the dominant mode. By reason of this, selecting an appropriate gap length will limit the loss of the dominant mode and reduce ripples resulting from higher-order transverse modes.

In various preferred embodiments of the present invention, moreover, it is preferred that the intersecting width of the intersection in the direction in which the electrode fingers extend be about 12.5λ or less, for example. Since ripples caused by higher-order transverse modes have greater impact with narrowing intersecting width, this makes the advantages of preferred embodiments of the present invention more significant.

It is to be understood that although in the above preferred embodiments the acoustic velocity V2 is preferably slow, thus generating a piston mode, by making the electrode fingers thicker in the first and second edge regions, the method for setting the acoustic velocity V2 slow is not critical.

Examples of alternative methods for setting the acoustic velocity V2 in the low-acoustic-velocity sections (first and second edge regions) slow include making the electrode fingers broader in the first and second edge regions than in the center region and placing an extra layer on the electrode fingers in the low-acoustic-velocity sections (first and second edge regions). The extra layer can be, for example, a metal film or dielectric film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric body; and
   interdigital transducer electrodes on the piezoelectric body; wherein
   the interdigital transducer electrodes include:
      opposing first and second busbars;
      a plurality of first electrode fingers connected at one end to the first busbar; and
      a plurality of second electrode fingers interdigitated with the first electrode fingers and connected at one end to the second busbar; wherein
   when an intersection is defined as an area in which the first and second electrode fingers overlap when viewed in a direction of propagation of an elastic wave, the intersection includes:
   a center region; and
   low-acoustic-velocity sections at both sides of the center region in a direction in which the electrode fingers extend, sections in which the acoustic velocity is lower than in the center region; and
   a length of a gap between an edge of the first electrode fingers and the second busbar and a length of a gap between an edge of the second electrode fingers and the first busbar are about 0.62λ or more and about 0.98λ or less, where λ denotes a wavelength determined by a finger pitch of the interdigital transducer electrodes.

2. The elastic wave device according to claim 1, wherein the piezoelectric body includes a support substrate, a multilayer film on the support substrate, and a piezoelectric thin film on the multilayer film.

3. The elastic wave device according to claim 2, wherein the multilayer film includes a stack of a high-acoustic-velocity film and a low-acoustic-velocity film on the high-acoustic-velocity film.

4. The elastic wave device according to claim 1, wherein the length of the gap between the edge of the first electrode fingers and the second busbar and the length of the gap between the edge of the second electrode fingers and the first busbar is about 0.72λ or more and about 0.92λ or less.

5. The elastic wave device according to claim 1, wherein the piezoelectric body is a rotated Y-cut LiNbO$_3$ substrate with an angle of rotation of about 116° or more and about 136° or less.

6. The elastic wave device according to claim 1, wherein a width of the intersection in the direction in which the electrode fingers extend is about 12.5λ or less.

7. The elastic wave device according to claim 1, wherein the first and second electrode fingers are thicker in the low-acoustic-velocity sections than in any other portion.

8. The elastic wave device according to claim 1, wherein in the low-acoustic-velocity sections, there is an extra layer on the first and second electrode fingers.

9. The elastic wave device according to claim 1, wherein the piezoelectric body is made of LiTaO$_3$ or LiNbO$_3$.

10. The elastic wave device according to claim 1, wherein the piezoelectric body is a piezoelectric ceramic substrate.

11. The elastic wave device according to claim 1, wherein the piezoelectric body is a piezoelectric thin film on a support substrate.

12. The elastic wave device according to claim 1, further comprising reflectors on both sides of the interdigital transducer electrodes.

13. The elastic wave device according to claim 1, wherein the elastic wave device is a one-port resonator or an elastic wave filter.

14. The elastic wave device according to claim 1, further comprising a dielectric film on the interdigital transducer electrodes.

15. The elastic wave device according to claim 1, wherein the elastic wave device is structured to generate a piston mode.

16. The elastic wave device according to claim 1, wherein the elastic wave device is structured to generate a fundamental mode or a first-order mode as a dominant mode.

17. The elastic wave device according to claim 1, wherein the length of the gap between the edge of the first electrode fingers and the second busbar and the length of the gap between the edge of the second electrode fingers and the first busbar are equal or substantially equal.

18. The elastic wave device according to claim 1, wherein the elastic wave device is structured to generate a piston mode free or substantially free of ripples caused by transverse modes.

* * * * *